United States Patent
Alasfour et al.

(10) Patent No.: US 10,615,745 B1
(45) Date of Patent: Apr. 7, 2020

(54) DEVICE AND METHOD FOR MEASURING EFFECT OF SOILING ON PHOTOVOLTAIC DEVICE

(71) Applicant: KUWAIT INSTITUTE FOR SCIENTIFIC RESEARCH, Safat (KW)

(72) Inventors: Abdulwahab Alasfour, Abdulla Al-Mubarak (KW); Abdullah Ramadhan Alkandary, Qortuba (KW); Feras Ghazi Alzubi, Safat (KW)

(73) Assignee: Kuwait Institute for Scientific Research, Safat (KW)

( * ) Notice: Subject to any disclaimer, the term of this patent is extended or adjusted under 35 U.S.C. 154(b) by 0 days.

(21) Appl. No.: 16/560,906

(22) Filed: Sep. 4, 2019

Related U.S. Application Data

(63) Continuation-in-part of application No. 16/244,041, filed on Jan. 9, 2019, now Pat. No. 10,447,201.

(51) Int. Cl.
  *G01R 29/24* (2006.01)
  *H02S 50/15* (2014.01)
  (Continued)

(52) U.S. Cl.
  CPC ............ *H02S 50/15* (2014.12); *G01N 21/94* (2013.01); *G01R 29/24* (2013.01); *H01L 31/02021* (2013.01); *H02S 40/10* (2014.12)

(58) Field of Classification Search
  CPC .......... H02S 50/10; H02S 50/00; H02S 10/00; H02S 99/00; H02S 40/10; G01N 21/94; G01R 29/24; H01L 31/02021
  (Continued)

(56) References Cited

U.S. PATENT DOCUMENTS

| 4,712,063 A | 12/1987 | Osterwald et al. |
| 9,590,559 B2 | 3/2017 | Jarnason et al. |

(Continued)

FOREIGN PATENT DOCUMENTS

| CN | 108745998 A | 11/2018 |
| WO | 2016011041 A1 | 1/2016 |

OTHER PUBLICATIONS

Leonardo Michell, An Investigation of the Key Parameters for Predicting PV Soiling Losses, Progress in Photovoltaics (2017). vol. 25, Iss. 4, pp. 269-337 (Year: 2017).*

(Continued)

*Primary Examiner* — Patrick Assouad
*Assistant Examiner* — Taqi R Nasir
(74) *Attorney, Agent, or Firm* — Richard C. Litman; Nath Goldberg and Meyer

(57) ABSTRACT

The device and method for measuring effect of soiling on a photovoltaic device includes a device in which a photovoltaic device (reference solar cell, solar cells, PV module, etc.) may be shifted between partially and fully enclosed compartments in quick succession for measurements of the same device (1) when directly exposed to illumination or solar radiation; (2) when placed under a glass or transparent cover maintained cleared or cleaned of soil; and (3) when placed under glass or transparent cover left exposed to natural outdoor soiling, or attenuated using simulated soil that is not periodically cleaned. The measurements may be of short circuit current (Isc), maximum power (Pmax), which are used to calculate the to soiling ratio. If the transparent covers have substantially identical optical properties and meet identical requirements for positioning relative to the DUT, only measurements (2) and (3) are required, and calculations of the soiling ratio are simplified.

13 Claims, 14 Drawing Sheets

(51) Int. Cl.
*G01N 21/94* (2006.01)
*H02S 40/10* (2014.01)
*H01L 31/02* (2006.01)

(58) Field of Classification Search
USPC ...... 324/51, 96, 126, 127, 133, 156, 761.01, 324/762.02–762.09; 375/240, 229, 233, 375/287, 288; 702/182
See application file for complete search history.

(56) References Cited

U.S. PATENT DOCUMENTS

| | | | |
|---|---|---|---|
| 9,598,586 | B2 | 3/2017 | Brophy et al. |
| 9,778,306 | B1* | 10/2017 | Prod'homme .......... H02S 50/10 |
| 10,171,029 | B2 | 1/2019 | Gostein et al. |
| 2006/0290343 | A1* | 12/2006 | Crafts .................... G01R 1/073 |
| | | | 324/754.18 |
| 2007/0164771 | A1* | 7/2007 | Lin .................... G01R 31/2846 |
| | | | 324/762.02 |
| 2013/0159064 | A1 | 6/2013 | Fisher et al. |
| 2015/0090311 | A1 | 4/2015 | Mau et al. |
| 2015/0280644 | A1* | 10/2015 | Gostein ................... H02S 50/00 |
| | | | 356/72 |
| 2016/0013329 | A1* | 1/2016 | Brophy ................. C09D 5/006 |
| | | | 136/256 |
| 2016/0190984 | A1* | 6/2016 | Caine ..................... H02S 50/00 |
| | | | 702/60 |
| 2016/0359453 | A1 | 12/2016 | Jones |
| 2017/0104451 | A1 | 4/2017 | Gostein |
| 2017/0230001 | A1 | 8/2017 | Gostein et al. |
| 2017/0338771 | A1 | 11/2017 | Gostein et al. |
| 2018/0159469 | A1 | 6/2018 | Trupke et al. |
| 2018/0278202 | A1 | 9/2018 | Gostein et al. |
| 2018/0337633 | A1 | 11/2018 | Tamizhmani et al. |

OTHER PUBLICATIONS

Micheli et al., "An Investigation of the Key Parameters for Predicting PV Soiling Losses", Progress in Photovoltaics (2017), vol. 25, Iss. 4, pp. 269-337.

* cited by examiner

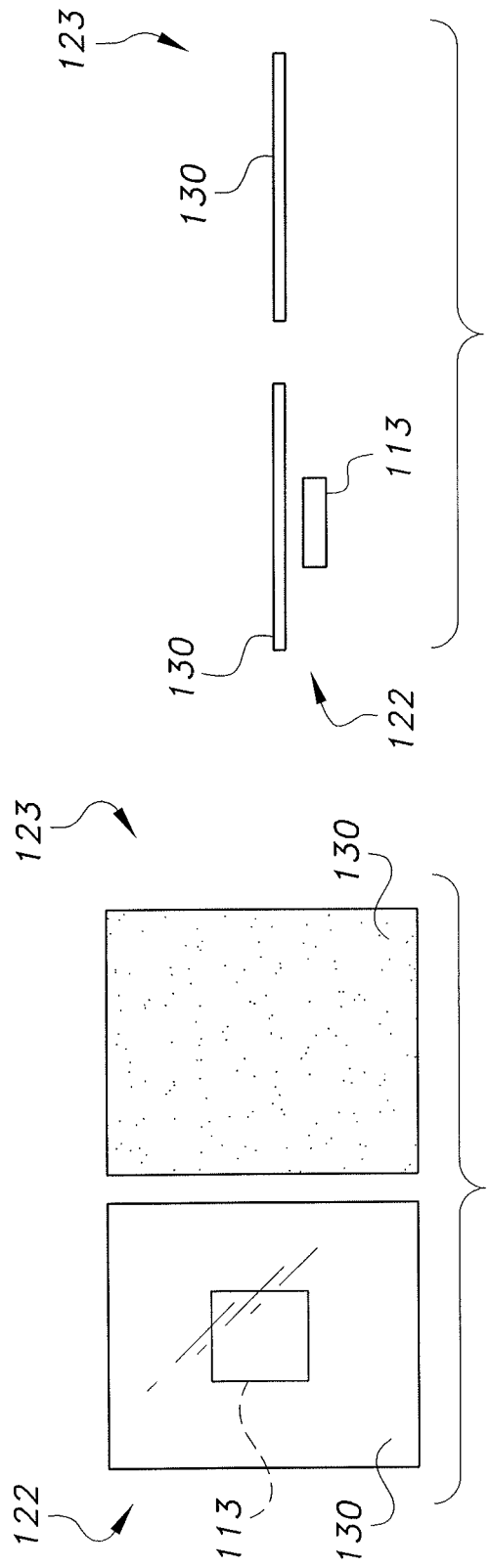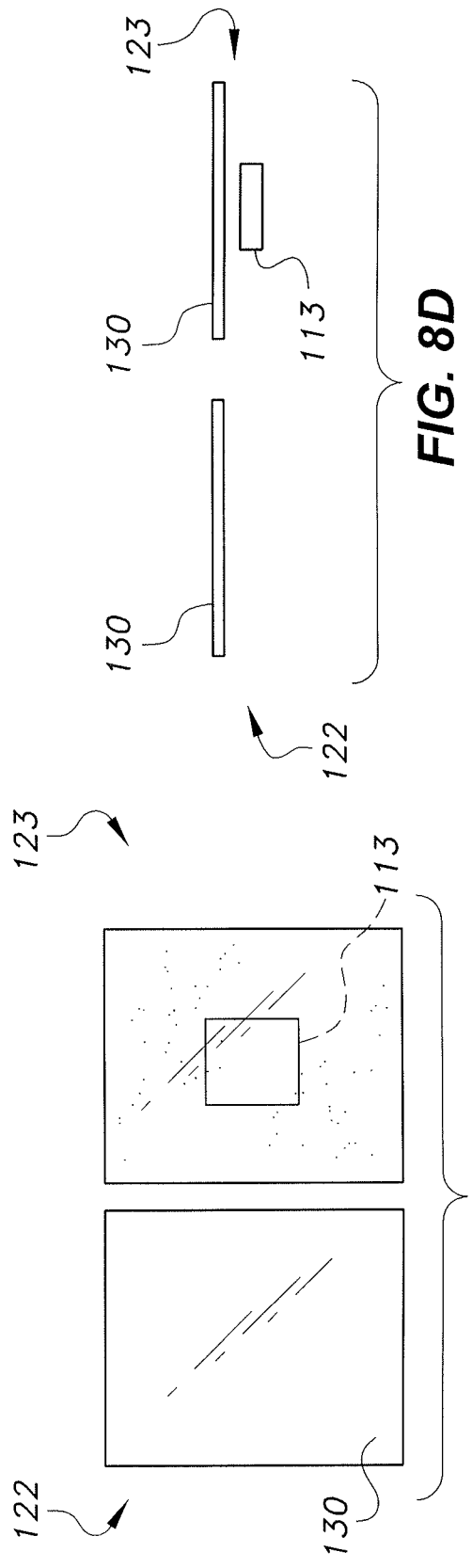

DEVICE AND METHOD FOR MEASURING EFFECT OF SOILING ON PHOTOVOLTAIC DEVICE

CROSS-REFERENCE TO RELATED APPLICATIONS

This is a continuation-in-part of our prior application Ser. No. 16/244,041, filed Jan. 9, 2019

BACKGROUND

1. Field

The present disclosure relates to measuring and testing of photovoltaic devices, and particularly to a device and method for measuring the effect of soiling on a photovoltaic device, such as a reference cell, a solar cell, or a photovoltaic module, to determine the change in electrical characteristics resulting from accumulated dust and other environmental contamination.

2. Description of the Related Art

One form of energy generation is the conversion of sunlight to electricity using a photovoltaic (PV) module that consists of electrically connected solar cells. When a group of modules are further connected, a PV system is formed, which typically ranges in size from residential to utility.

When PV systems are installed in outdoor locations, one of the most detrimental environmental factors that affects their performance is the accumulation of soil, which is the settlement of dust particles, debris, and/or other contaminants on the surface of PV modules, otherwise known as soiling. Performance degradation occurs because when particles settle on the surface of PV modules, they interfere with incoming light by blocking, attenuating, and/or scattering it. The power output that is lost as a result is known as the Soiling Loss (SL). Many research groups in dust-intensive regions have reported SL values well above 20%. For example, a PV system that was installed in a desert region tilted at 20° lost up to 60% of its power after six months of no cleaning.

Such high soiling loss values result in significant revenue deficiencies and excessive operation and maintenance costs. Consequently, there has been a growing interest in quantifying and monitoring such an environmental factor, as the deployment of PV systems in dust-intensive climates is rapidly increasing. This is especially true for utility-scale PV systems, as it improves energy prediction models, optimizes PV Plant cleaning strategies, and creates a new performance assessment tool.

Fundamentally, existing soiling detectors are implemented by measuring one of three primary parameters, viz., soil mass; light transmission; or PV performance. The latter parameter has been widely adopted by PV practitioners and researchers for directly measuring the power loss due to soiling. This method of soiling detection measurement involves comparing the power output of an installed reference PV device (i.e., cleaned daily) to a test PV device (i.e., left to naturally soil).

Although performance-based measurements using two PV devices offer a direct way to measure SL, the method involves high uncertainty, since it assumes that the two devices are identical. However, it is well established that PV devices fabricated using the same materials and processes have intrinsic differences. Such differences include (a) Quantum efficiency (QE); (b) Angular response (Ar); (c) Thermal response (Tr); (d) Parasitic resistances (Pr); and how these four parameters change over time.

Therefore, simply comparing two PV devices to measure soiling while neglecting the aforementioned differences will introduce high measurement uncertainty. Using this method, errors as high as 4.5% have been reported. Although a few researchers have considered accommodating such factors, their approaches require intensive periodic in-lab PV assessment, which renders them impractical for long-term monitoring. Thus, a device and method for measuring the effect of soiling on a photovoltaic device solving the aforementioned problems are desired.

SUMMARY

The device and method for measuring the effect of soiling on a photovoltaic (PV) device are used to provide data representative of deterioration in performance from soiling of PV devices. In a first embodiment, a test jig with a test enclosure having first, second and third measurement stations can be used. In this embodiment, the first station is substantially external to the test enclosure and is used to obtain reference values for a PV device as a device under test (DUT); this station will be interchangeably referred to as the initial state hereinafter. The second and third stations are within a test enclosure. A support for the DUT has the capability of transporting the PV device between the first, second and third stations for sequential testing on the same device under different conditions. At the first station, the DUT has substantially full, direct, unobstructed exposure to a light source, defining a first state. At the second station, the DUT has exposure through a transparent cover of the enclosure that is maintained in clean condition, defining a second state. In this regard, the transparent cover of the second compartment is adapted for a wide range of cleaning frequency (minutely, hourly, daily, etc.) At the third station, the DUT has exposure through a transparent cover of the enclosure that has been exposed to natural outdoor soiling or attenuated using simulated soil, defining a third state. In the first state, the exposure comprises light passed directly to the PV device, substantially without passing through the enclosure. In the second state, the exposure comprises light passed to the PV device through the transparent cover in a clean state. In the third state, the exposure comprises light passed to the photovoltaic device through a transparent cover in a soiled state. A measuring and test unit is configured to measure short circuit current (Isc), maximum power (Pmax), and/or other criteria in the three states in quick succession and report the result in a novel ratio to show the loss in current or power resulting from soiling conditions. The device may be computerized to monitor changes in the ratio and/or store and manipulate data relating to the efficiency of the PV device under test. The disclosed technology serves as a platform for PV device testing under soiling conditions. It can accommodate any mono-facial PV technology, thus allowing for a wide range of potential applications.

It has been found that if certain conditions are met, the first station is not needed, so that in a second embodiment, only two stations are required, one having a transparent cover that is maintained in a clean condition, and the other having a transparent cover left exposed to natural outdoor soiling or simulated soil. Thus, only two measurements need to be made, one with the DUT being disposed under the clean transparent cover, the other with the DUT disposed under the soiled transparent cover. The conditions include six conditions related to the optical/physical properties of the transparent covers and two conditions related to the configuration of the measuring device. When these conditions are met, this embodiment permits the use of a method referred to herein as the Electro-Optical Soiling Isolation (EOSI) method of measuring the effect of soiling on a photovoltaic device, which uses electro-optical techniques instead of pure electrical techniques to reduce measurement errors that might otherwise be introduced due to the optical alteration of incoming light as a result of using the two covers, thereby producing more accurate measurements. The EOSI method also introduces quality control steps to ensure repeatability of the measurements.

These and other features of the present disclosure will become readily apparent upon further review of the following specification and drawings.

BRIEF DESCRIPTION OF THE DRAWINGS

FIGS. 8A and 8B are schematic top and side views, respectively, of an embodiment of a device for measuring the effect of soiling on a photovoltaic device having only two stages, showing the photovoltaic device positioned under a clean transparent cover.

FIGS. 8C and 8D are schematic top and side views, respectively, of an embodiment of a device for measuring the effect of soiling on a photovoltaic device having only two stages, showing the photovoltaic device positioned under a soiled transparent cover.

Similar reference characters denote corresponding features consistently throughout the attached drawings.

DETAILED DESCRIPTION OF THE PREFERRED EMBODIMENTS

Figure 1A:
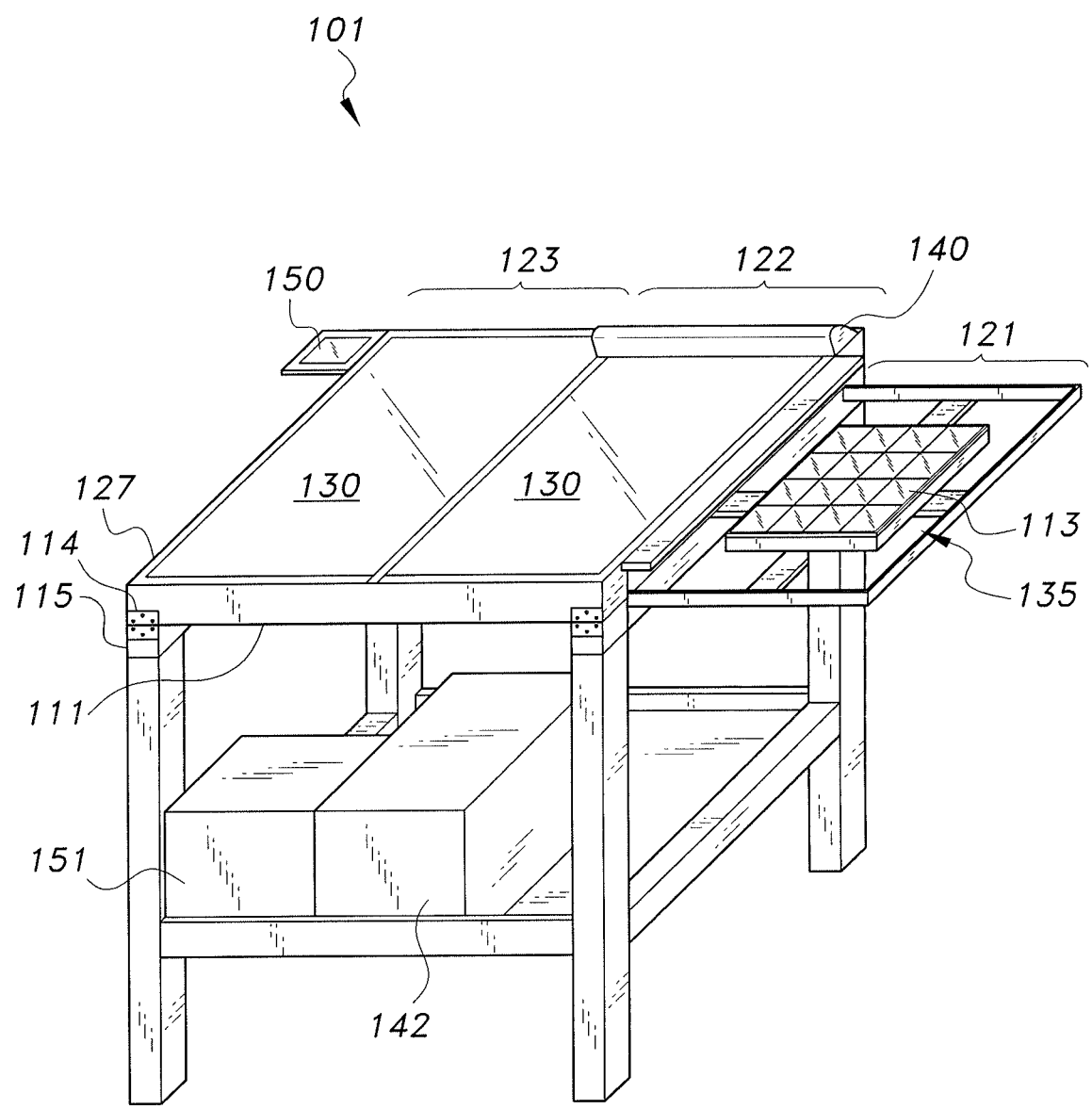
FIG. 1A is a perspective view of a device for measuring the effect of soiling on a photovoltaic device, shown in its east-west (E-W) lateral orientation and largely schematic.

The device and method for measuring the effect of soiling on a photovoltaic (PV) device includes a device in which a PV device (solar cell, PV module, etc.) may be shifted between partially and fully enclosed compartments in quick succession for measurements of the same device (1) when directly exposed to illumination or solar radiation; (2) when placed under a transparent cover maintained cleared or cleaned of soil; and (3) when placed under transparent cover left exposed to soiling that is not periodically cleaned. The measurements may be of short circuit current (Isc), maximum power (Pmax), and/or other parameters conventionally used to evaluate the performance of the PV device. Each measurement may be an instantaneous value, or a measurement of changing values over a predetermined time interval, e.g., an I-V curve. A soiling ratio calculated as:

$$SR_{Pmax} = 1 - \frac{P_{max2} - P_{max3}}{P_{max1}}$$

or calculated as:

$$SR_{Isc} = 1 - \frac{I_{sc2} - I_{sc3}}{I_{sc1}}$$

may be used to compare or monitor the effectiveness of the PV device between measurement cycles.

To capture the soiling effect using a single device, the PV device is required to be measured under three different states. State 1 will be the initial state where the Isc, Pmax, and/or other parameters of the PV device are measured. The device will then move to State 2 and a similar measurement to the initial state, State 1, will be taken under a clean transparent cover. For the final state, State 3, the same measurement will be repeated under a soiled (i.e., never cleaned) transparent cover. Because the extra layer of transparent cover in States 2 and 3 will introduce an additional power loss, measurements in all 3 states need to be mathematically compensated for this extra layer. To further ensure accuracy, all three states will be measured in a sufficiently short period of time. Any deviations in PV temperature and/or amount of sunlight received from the states will be normalized. This process allows for the computation of the Soiling Ratio (SR) as an indicator of PV performance loss resulting from soiling. Since the new disclosed technology utilizes a single PV device, the SR will be expressed as:

$$SR_{Pmax} = \frac{P_{max\,dirty}}{P_{max\,clean}} = \frac{P_{max3} + (P_{max1} - P_{max2})}{P_{max1}} = 1 - \frac{P_{max2} - P_{max3}}{P_{max1}}$$

and/or as:

$$SR_{Isc} = \frac{I_{sc3} + (I_{sc1} - I_{sc2})}{I_{sc1}} = 1 - \frac{I_{sc2} - I_{sc3}}{I_{sc1}},$$

where SR is the Soiling Ratio, $P_{max}$ is the power at the maximum power point, $I_{sc}$ is the short circuit current, and the subscripts 1, 2, and 3 refer to the State in which the measurement was made.

The use of a single PV device minimizes uncertainties stemming from complex differences that inherently exist between two similar, but nonidentical devices. This provides a low-cost technique offering practical in-field use because it does not require cumbersome periodic operation and maintenance cycles. Furthermore, for an accurate soiling representation of a PV system, the user is not confined to a limited set of PV technologies (i.e., some products supply only one type), but broadens the scope of work to accommodate any desired mono-facial technology. Ultimately, the technique is intended to provide a reliable, practical, and affordable soiling monitoring system for widespread applications that extend from research to industry. In particular, this technique advances the optimization of PV cleaning cycles and cost, monitoring energy production losses due to soiling, studying the effectiveness of new anti-soiling surface coatings, and the collection of site-specific data.

According to the method, three consecutive Isc, Pmax, and/or other parameter measurements of the PV device are taken, first, under no transparent cover (State 1), then under a clean transparent cover (State 2), and finally under a soiled transparent cover (State 3). These measurements can be achieved in a sufficiently short period of time. Measuring one PV device can effectively eliminate the uncertainties stemming from two nonidentical devices. The disclosed technology can be a standalone system where no external power supply is needed to allow installation in remote areas.

Software may be provided to enable the user to monitor and control the sensor system. Features such as data analysis, data presentation, and data extraction can be included. As part of the data acquisition system, software may be provided in any convenient form, such as a desktop, as web-based software, or using a handheld device. The software can also be integrated with the data acquisition system. The system may execute functions including, but not limited to, the following: receive data of physical variables; process data; provide a graphical user interface; offer analytic tools for researchers and industry; forecast and compute optimal cleaning time; export records and reports in text or other portable data formats; detect system faults; configure features of system hardware, such as motor and fan speeds; and integrate with standard SCADA systems for PV power plants. In addition to the above-mentioned features, the software will have built-in features that would allow a user, such as an administrator, to change the way data is organized, computed, and filtered, which allows for device optimization.

Figure 1B:
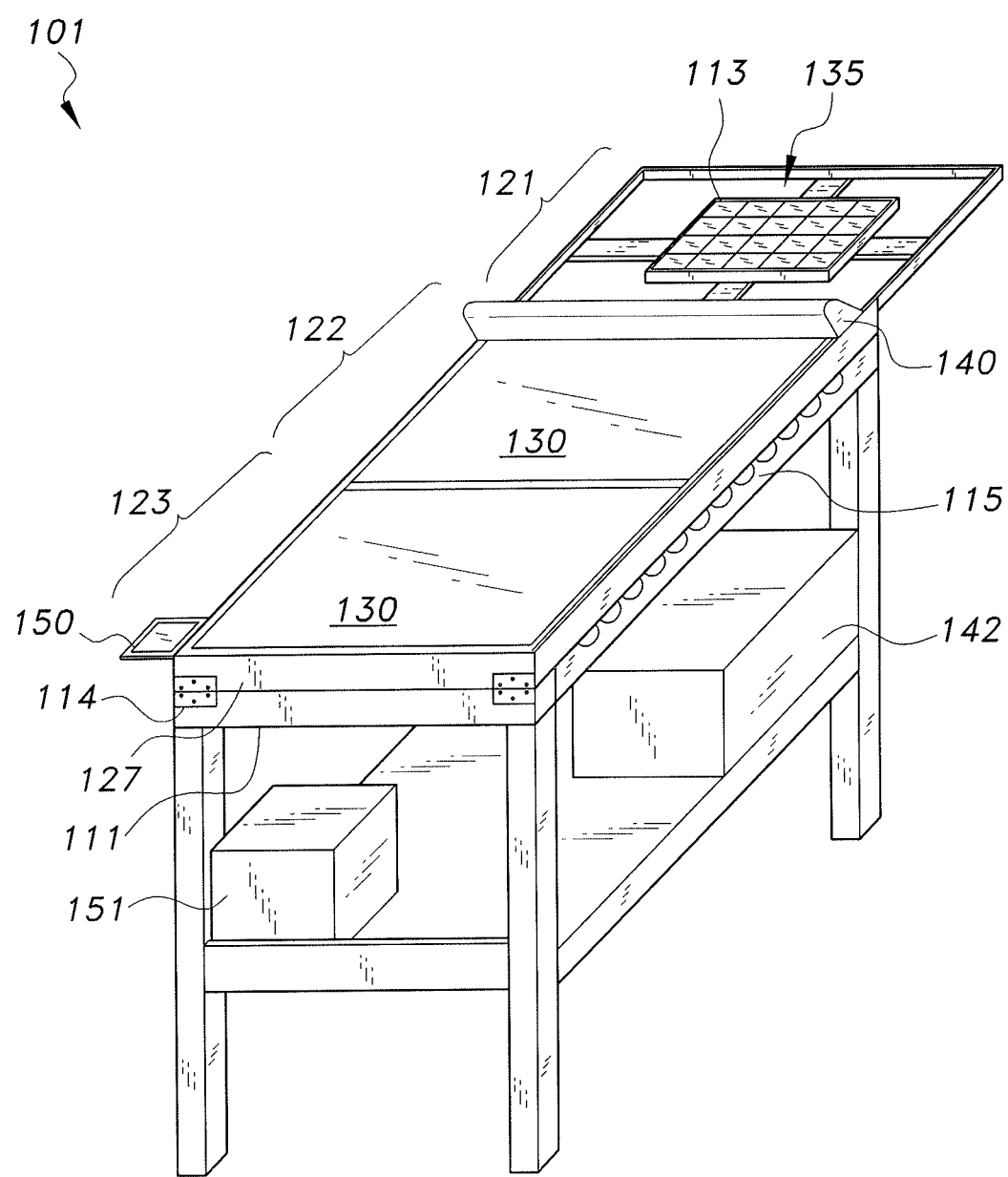
FIG. 1B is a perspective view of a device for measuring the effect of soiling on a photovoltaic device, shown in its north-south (N-S) axial orientation and largely schematic.

FIGS. 1A and 1B are schematic diagrams of a device 101 configured for measuring the effect of soiling on a photovoltaic device, shown in a lateral configuration and in an axial configuration, respectively In the latter configuration, the PV device is measured along the north-south direction rather than the east-west direction between states, which yields higher measurement accuracy and allows for new parameters to be evaluated. Depicted is a frame housing 111 for testing a PV device, such as a PV module component 113, as a device under test (DUT). The device 101 has three test stations, 121, 122, 123, corresponding to three measurement states, State 1—initial, State 2—clean and State 3—soiled. Test station 121 is only partially enclosed, being exposed directly to the outside environment for receiving illumination or solar radiation, whereas test stations 122 and 123 are provided as an enclosed compartment portion 127 of the device 101. A transparent cover 130, such as a tempered PV glass, forms a top of enclosed portion 127. It is noted, however, that, at test station 123, the transparent cover 130 is soiled without any cleaning throughout the soiling monitoring cycle. The DUT 113 can be removed from its housing so that it can be characterized either by its OEM or by an independent laboratory when needed.

Nevertheless, the device 101 can be used to compare operational parameters in the three states, provided care is taken to not damage the DUT 113 during routine testing. In the device 101, the DUT is transported through stations 121, 122, and 123 to measure the electrical output at each station in a sufficiently short period of time such that environmental variations between the three measurements are kept to a minimum.

As can be seen in FIG. 1A, the DUT component 113 is shown outside of an enclosed portion of the device 101, but still supported by the device 101 at test station 121, corresponding to "State 1—initial". Both the DUT component 113 and the tray 135 holding it are coplanar with the other testing stations 122 and 123.

The DUT component 113 is then moved inside the device 101 to test station 122. Test station 122 is within the enclosed portion of the device 101, under a portion of the device 101 (a transparent cover 130) maintained in a clean state. Testing at test station 122 corresponds to "State 2—clean". In the enclosed portion of the device 101, light passes through a transparent cover 130, which, at test station 122, is maintained in a substantially clean condition.

The DUT component 113 is then moved inside the device 101 to test station 123. Test station 123 is within the enclosed portion 127 of the device 101, under a portion of the device 101 left in a soiled state. Testing at test station 123 corresponds to "State 3—soiled".

While a single enclosure is shown for test stations 122 and 123, it is understood that test stations 122 and 123 may be provided with separate enclosures, each with a separate transparent cover 130, but with station 123 in a soiled state. Likewise, a single test station can be used to provide the test operations of test stations 121, 122 and 123 with a single PV device, with the test station being changed by uncovering the DUT for State 1, covering the DUT with the clean transparent cover for State 2, and covering the DUT with the same or a different cover, but in a soiled state, for State 3.

The "State 3—soiled" condition can be adapted to outdoor local conditions. Examples of environmental debris or contamination can be dust from wind, vegetation debris, and soiling from birds or animal waste, all of which can vary according to the location of the test site.

The device 101 may have a support tray 135, which can be used to transport the DUT between the test stations, 121, 122, 123, either manually or automatically.

The device 101 is used to determine a performance difference between a clean state, described as "State 2—clean", and a soiled state, described as "State 3—soiled". The device 101 can then be used to determine the difference in electrical output when a PV device's surface becomes soiled.

Ventilation fans (not separately shown) may be used to reduce heat buildup until internal temperature and humidity sensor readings substantially agree with the ambient. When the DUT is at rest, and no measurements are being taken, the ventilation fans may operate to protect the internal components of the device 101 inside the enclosed compartment portion 127. Further, the enclosed compartment portion 127 can be opened for scheduled and unscheduled maintenance. The cleaning of the transparent cover 130 may be done either manually or automatically using a built-in washer 140.

The device 101 has a tilting mechanism component 114, which can adjust the tilt angle of test stations, 121, 122, 123, the tray component 135, and the DUT component 113 concurrently between 0° (i.e., parallel to the ground) to 90° (i.e., perpendicular to the ground) either manually or automatically.

Figure 2:
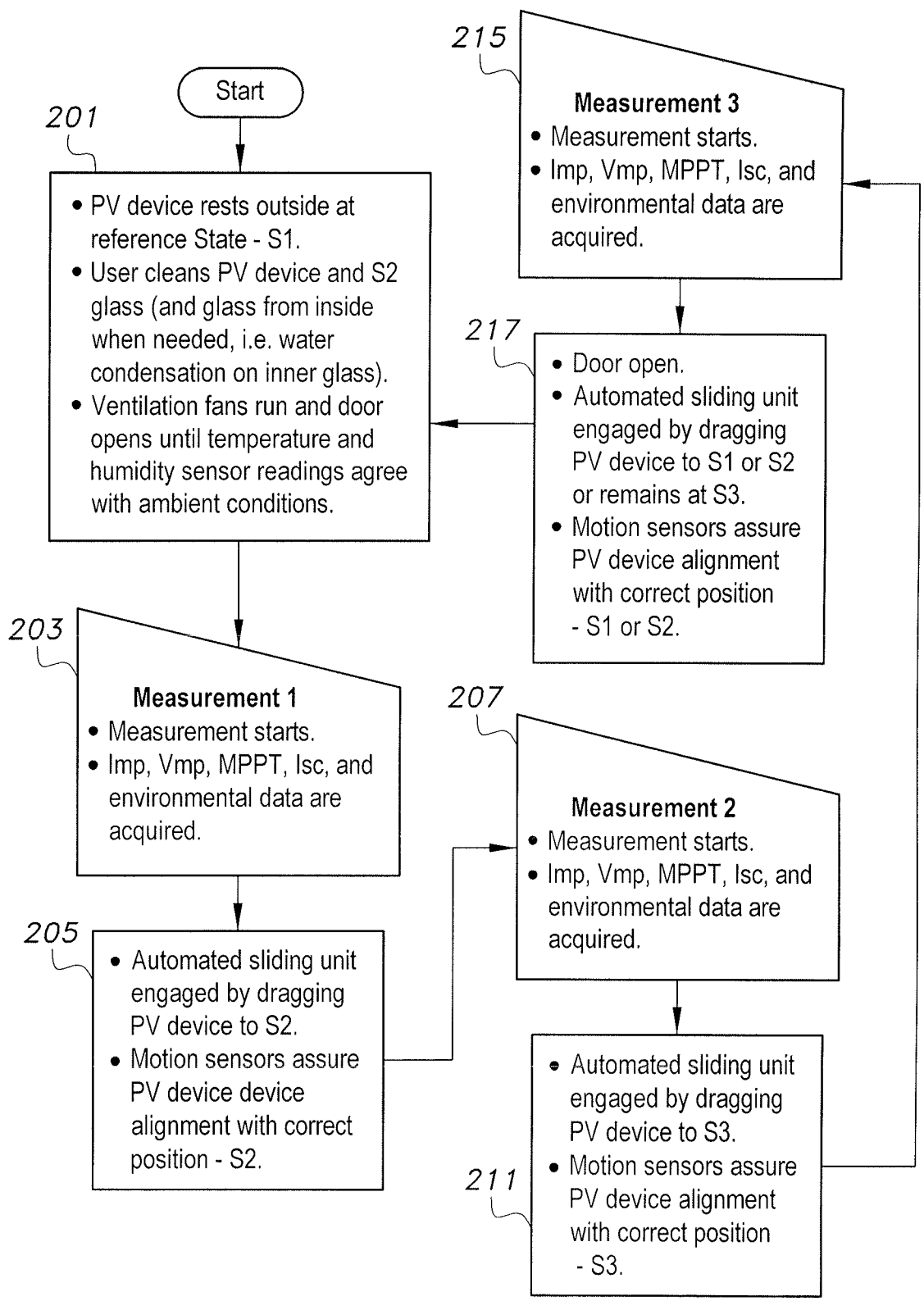
FIG. 2 is a flowchart showing mechanical steps in taking of measurements in three measurement states in a measurement cycle.

FIG. 2 is a flowchart showing one variation of the mechanics of taking measurements in States 1, 2 and 3. In each test sequence, testing is performed for short circuit current (Isc), maximum power (Pmax), and/or other criteria of the DUT component 113. Environmental data is also taken.

Referring to FIG. 2, the DUT is initially placed in a position outside the enclosure 127 of the device 101, and the test station 122 is cleaned, if needed (step 201). Measurement 1 is then taken (step 203). The DUT is then moved (step 205) into the enclosure 127 of the device 101 at test station 122 for testing in a clean state, as Measurement 2. The difference is that substantially all factors imposed by enclosing the DUT in enclosure 127 are present. The DUT is then tested (step 207). The DUT is then moved (step 211) for testing (step 215) in a soiled state, as Measurement 3. In the soiled state, the device's 101 third test station 123 is either naturally soiled with dust and other environmental debris, or simulated dirt can be used at test station 123, and measurements are taken under those conditions (step 215), which is Measurement 3.

In an automated process, the DUT is placed in a position outside the enclosure of the device 101, and automated movement is achieved by motor controls to move the support tray 135. The support tray 135 transports the DUT for measurements 1, 2, and 3 (with measurement 1 performed before movement). This provides automated acquisition of measurements for each test station where the DUT is evaluated.

On completion of the measurements, after obtaining Measurement 3 (step 215), the DUT is moved (step 217) to rest either at station 1, station 2, or remain at station 3 between measurement cycles.

One difference between Measurements 1 and 2 is that a baseline is established to account for losses due to the construction of the device 101 itself. In that way, the measurements taken under the regimes of Measurements 2 and 3 represent the changes resulting from the soiling represented by Measurement 3, with the effects of the device 101 canceled out by the difference between Measurements 1 and 2.

Figure 3A:
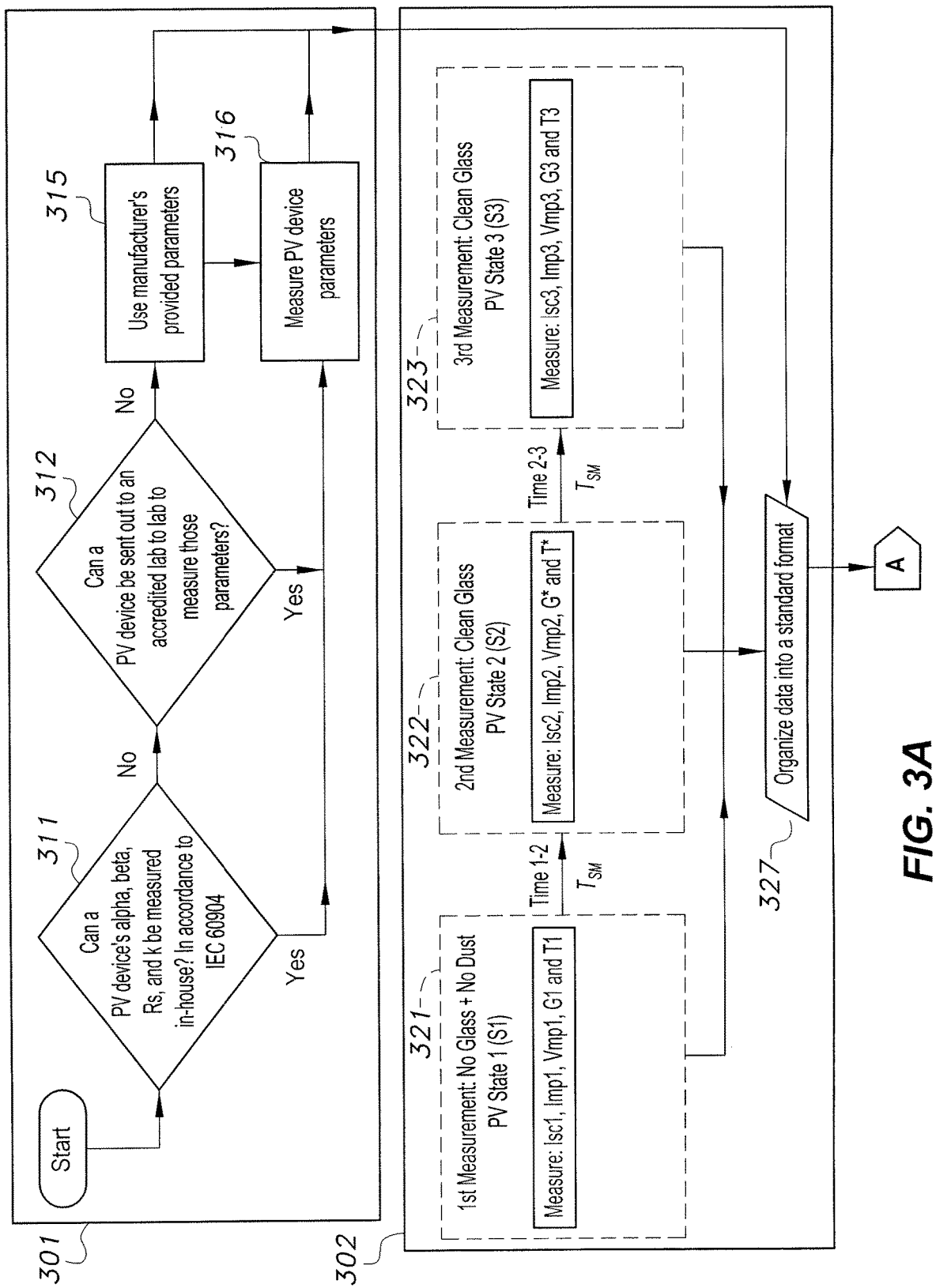
FIGS. 3A, 3B, and 3C are a flowchart showing the steps in a first embodiment of a method for measuring the effect of soiling on a photovoltaic device.
Figure 3B:
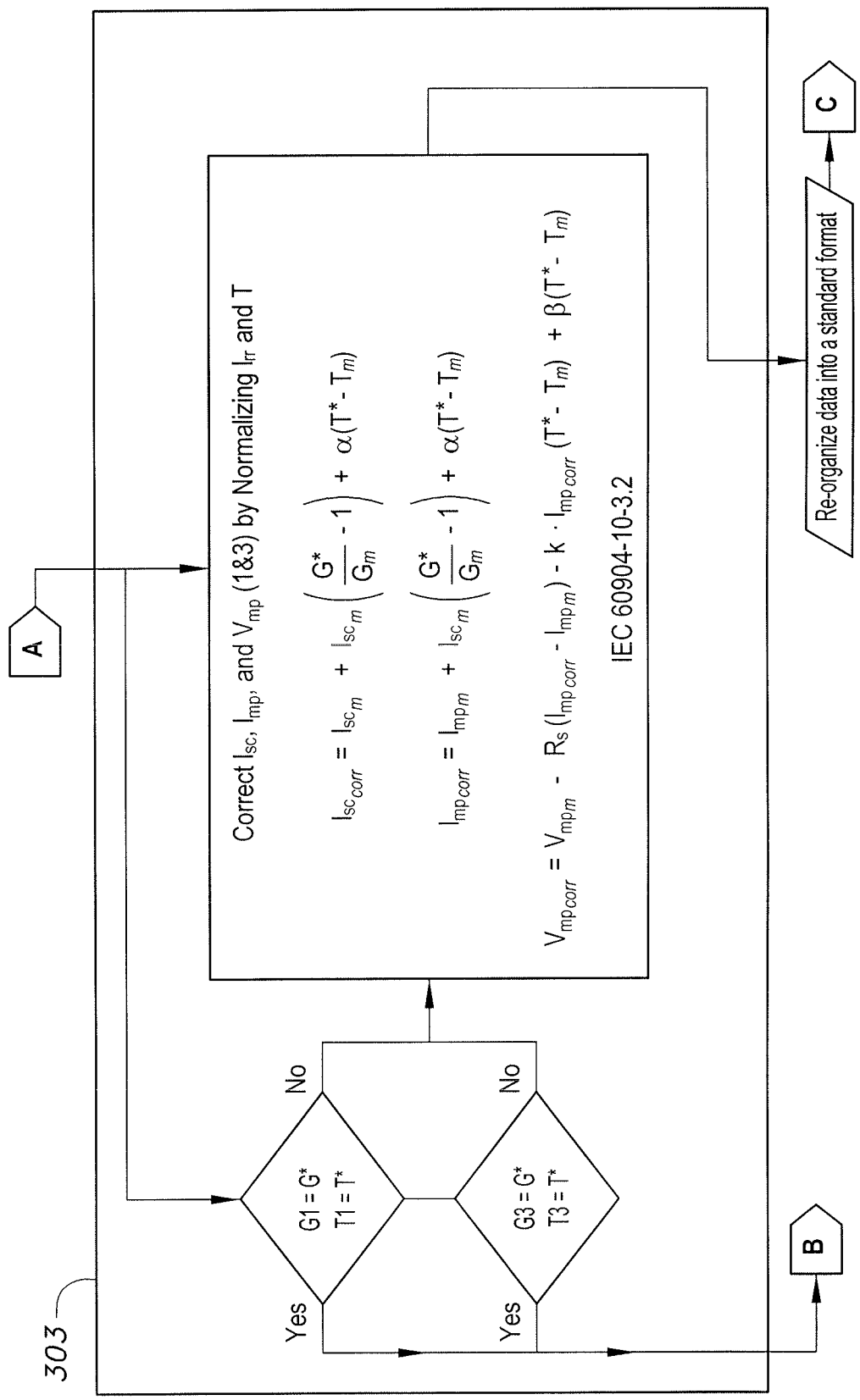
Figure 3C:
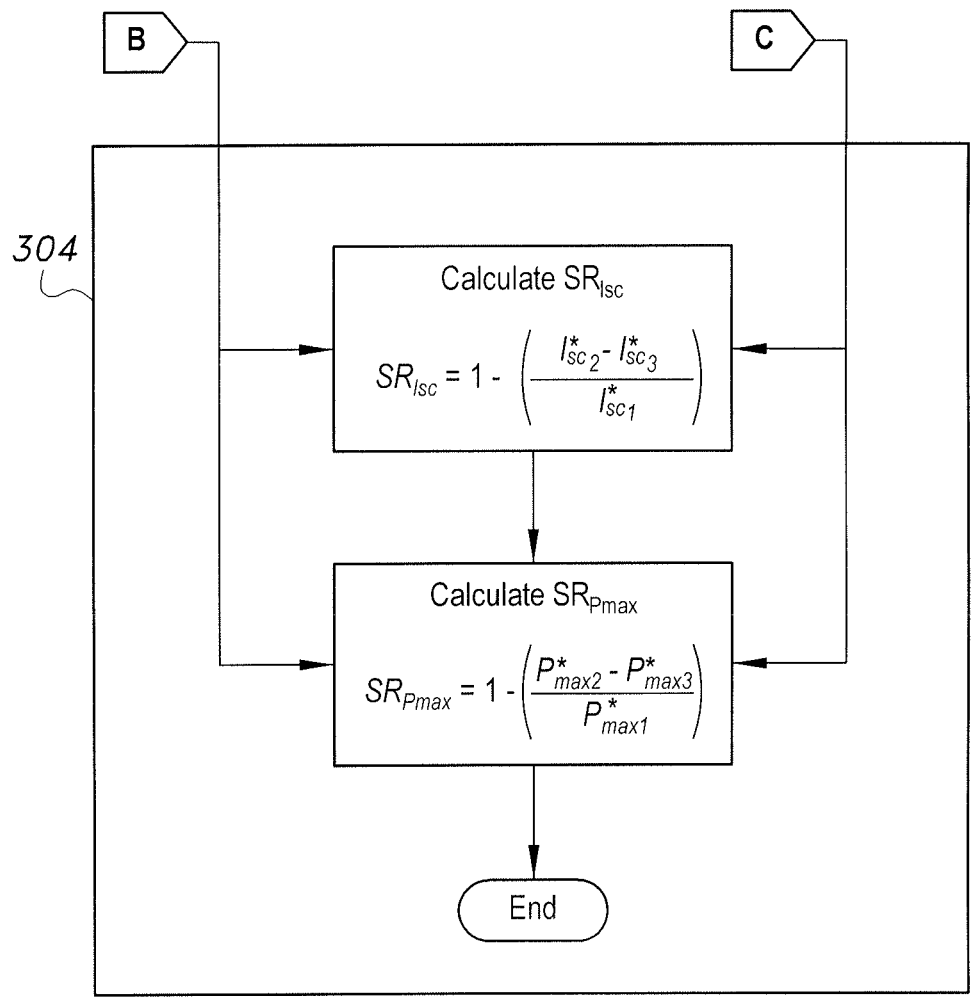

FIGS. 3A-3C are flowcharts showing the procedures and set-up required for obtaining soiling measurements when using a single PV device. The process comprises of pre-installation 301, field measurements and data acquisition 302, normalizing weather conditions to a reference state 303 (i.e. state 2), and computation of soiling ratio (SR) 304.

In the pre-installation step 301, a determination (step 311) is made of the ability to measure the PV device's alpha, beta, Rs and k values. Ideally, these values can be measured in the lab (in-house measurements) in accordance to IEC 60904. If it is not possible to obtain some of these measurements, a determination (step 312) is made as to whether measurements can be obtained from other accredited labs or supplied from another source. In either case, if these measurements cannot be made, then manufacturer-supplied parameters are used (step 315). If these values can be measured, then the device parameters are measured (step 316). Similarly, if some, but not all, parameters can be measured, then these parameters are used in combination with manufacturer-supplied parameters.

The parameters are provided for use in field measurements and data acquisition 302. Three measurements are used to obtain values for States 1, 2 and 3. In State 1, the measurement is taken with no transparent cover and the DUT is substantially clean (step 321). In State 2, a measurement is taken with clean transparent cover (step 322), and in State 3, a measurement is taken with soiled transparent cover (step 323). The measured data is organized into a standard format (step 327).

After obtaining the data for each of States 1, 2 and 3, normalized 303 for weather conditions, a computation is made of a soiling ratio. In the normalization according to weather conditions 303, adjustments are made so that weather conditions as would affect the measurements are taken for State 2. These same adjustments are then applied to States 1 and 3. The normalized data is re-organized into a standard format (step 367) for use in the process for computing the soiling ration (SR) 304.

Additional functions may be implemented within the scope of this disclosure, which may comprise combining an automatization capability to periodically clean the "clean transparent cover" (required step) in addition to manual cleaning; providing an ability to both manually and automatically move the PV device from State 1, 2, and 3; development of universal design to accommodate all PV sizes; combining the device with a weather station; moving the transparent cover of stations 2 and 3 over the fixed DUT at station 1 to make the three sequential measurements required; and combining the device with a solar simulator for indoor testing.

Figure 4:
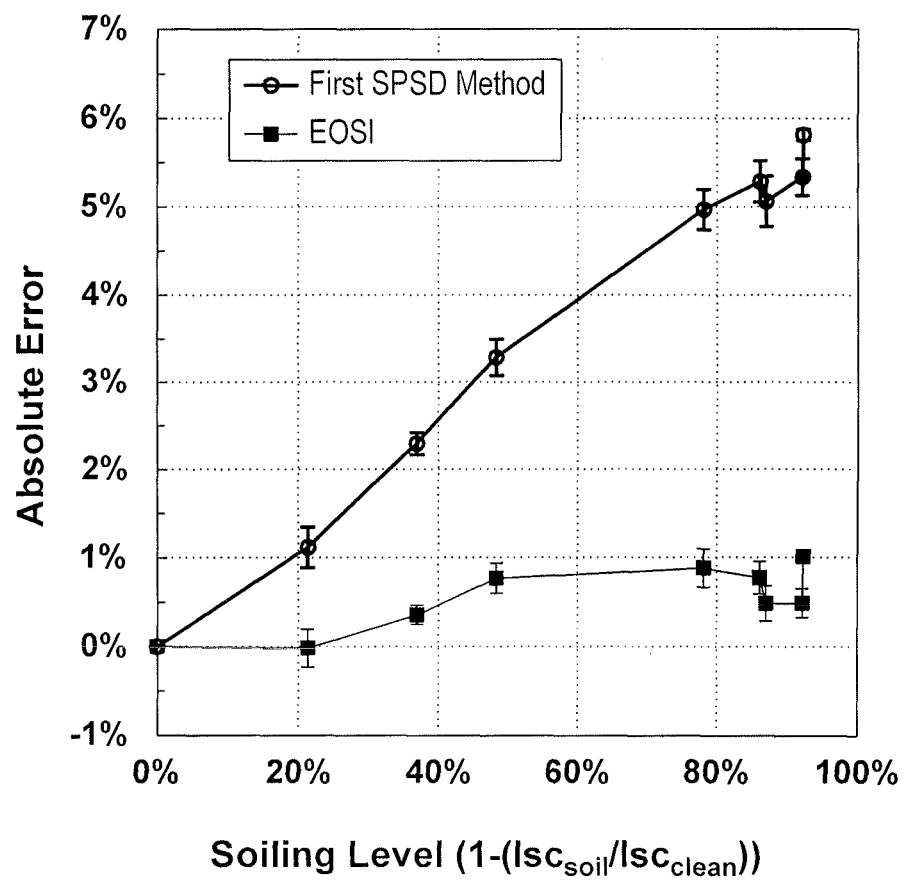
FIG. 4 is a scatter plot of cover-induced errors as a function of soiling level, comparing results obtained by correcting for such errors using electrical techniques (the first embodiment of the method for measuring the effect of soiling, or the first SPSD method) with results obtained by correcting for such errors using electro-optical techniques (the second embodiment of the method for measuring the effect of soiling, or the EOSI method).

Although the device and method described above represent a substantial advance in the art, particularly through making the measurements on a single PV device, thereby avoiding errors that enter into the results obtained by devices and methods that make measurements on multiple similar PV devices without properly compensating for the inherent differences between them, it is still limited by errors introduced by using the transparent covers. The above-described method is referred to herein as the first Single PV Soiling Detection (SPSD) method. FIG. 4 is a scatter plot showing the results obtained using the above-described SPSD method, as compared to the EOSI method described below. The error bars represent the standard deviation of six measurements, and the coverage factor is k=2. The measurements were taken using a AAA solar simulator under STC conditions (Standard Test Conditions). As shown in FIG. 4, in order to maintain the error in measurements down to ±1% using the first SPSD method, the soiling level, defined as $1-(Isc_{soil}/Isc_{clean})$, should be approximately 20% or less.

This restriction comes as a consequence of errors that exist due to the optical alteration of incoming light (i.e., change in direction and/or intensity) by the two transparent covers used in all SPSD set-ups (i.e., one PV device and two transparent covers). Such errors will be referred to as cover-induced errors hereinafter. Although the SPSD method of the first embodiment uses an Electrical Correction (EC) technique to minimize cover-induced errors, it only considers changes in light intensity and not changes in direction. Furthermore, it incorrectly assumes that the amount of intensity that would be reduced as light passes through both covers is equal (i.e., since the two covers are the same). It has not considered that despite having the same optical characteristics, the soiled cover will always reduce less intensity than the clean cover as a consequence of receiving less incoming light attenuated by the top soil layer. Thus, as soiling concentration increases, the difference of the light intensity reduced between the two covers will increase as well, rendering the EC technique less effective.

Therefore, the range of measurement for the first SPSD method is fundamentally limited to low soiling concentrations.

In order to maintain high measurement accuracy for all soiling concentrations, a second embodiment of the device and method for measuring the effect of soiling on a photovoltaic device uses a different SPSD method, referred to as the EOSI method hereinafter. Unlike the first SPSD approach, this method applies an Optical Elimination (OE) technique to suppress cover-induced errors, which principally focuses on the optical changes of light, rather than the electrical losses induced by the covers. That is, it mathematically cancels out light intensity effects, and by design, minimizes light direction alterations for accurate PV soiling measurements. To this end, the EOSI method outlines a process consisting of the following five main steps: (1) obtain correction parameters, (2) prepare set-up, (3) take measurements, (4) quality control, and (5) compute Soiling Ratio (SR) and Soiling Loss (SL).

Figure 5:
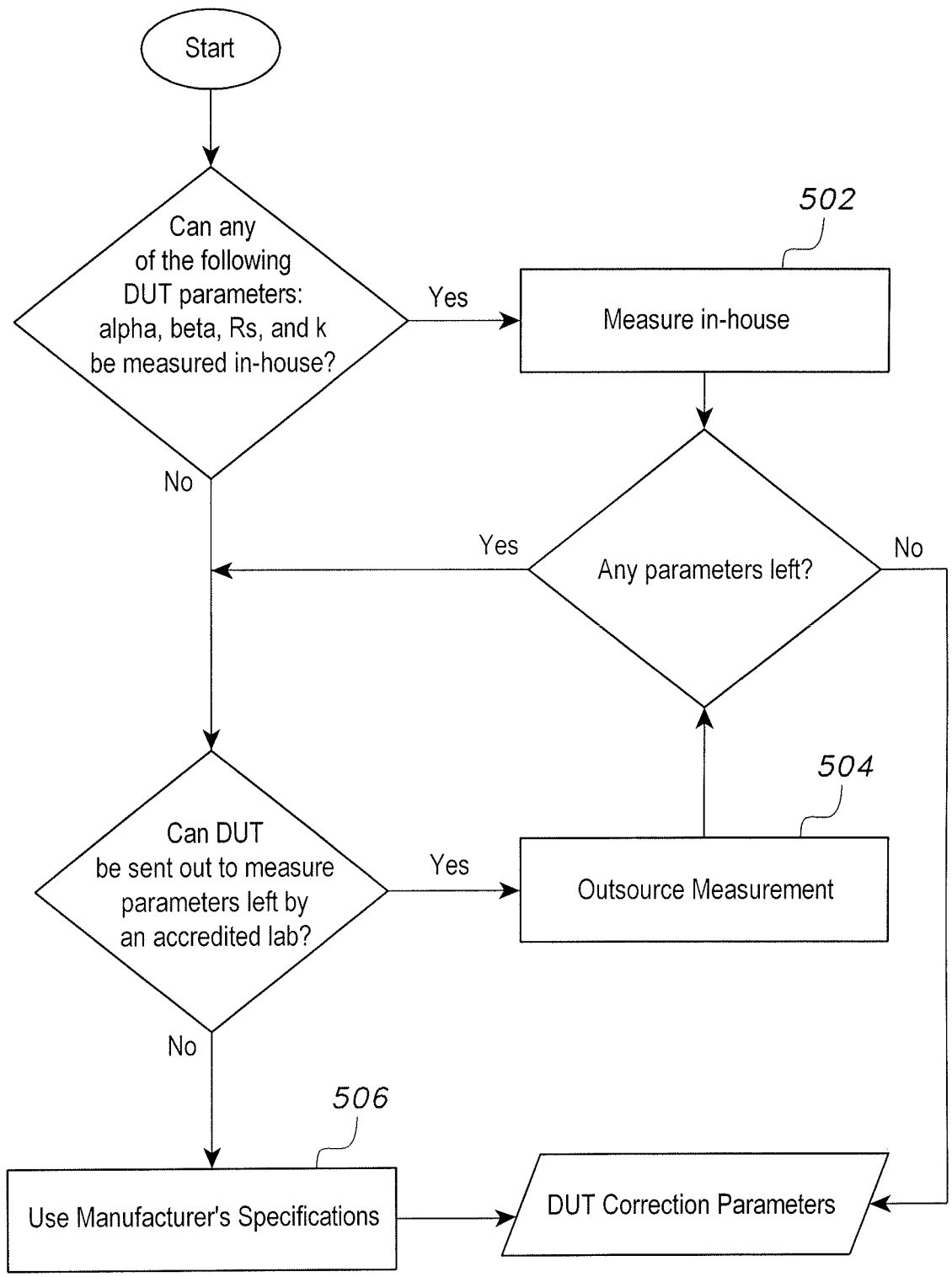
FIG. 5 is a flowchart showing the steps for obtaining several correction parameters associated with the device under test (DUT) (i.e., the PV device).

FIG. 5 presents a flowchart implementing the first step (i.e., obtain correction parameters), describing how to obtain several correction parameters (particularly the temperature coefficients α and β, the series resistance [$R_S$], and the IV curve correction factor [κ]) associated with the DUT. Such parameters are required in order to temperature-correct the performance of the DUT and minimize measurement errors. Since each DUT is different (i.e., even if it is from the same manufacturer), the correction parameters of the DUT are recommended to be obtained either in-house (step 502) or at an accredited laboratory (step 504) in accordance with the procedures defined in IEC 60904 (International Electrotechnical Commission standard 60904). If that is not possible, the parameters provided in the DUT's data sheet shall be used (step 506). The order of this step is not critical. The correction parameters may be obtained at any time prior to step 5.

After acquiring the DUT correction parameters, the next step (i.e., step 2, prepare set-up) is to prepare the physical set-up required for measurement. A flowchart that visually describes this step is provided in FIG. 6. Because the EOSI method falls under the general SPSD category, it utilizes two transparent covers (i.e., where one permits natural or artificial soil deposition and the other is maintained clean) and a single DUT. As mentioned earlier, to suppress cover-induced errors, an OE technique shall be used to cancel out light intensity cover effects and minimize light direction alterations. The success of this technique is largely dependent on both the covers and physical measurement set-up. As such, the EOSI method has set four requirements on those two factors.

The first requirement is that for all incoming relevant spectral wavelengths (i.e., to the DUT) at any angle of incidence (AOI), transmittance through the covers must be constant (referred to hereafter as (1) Constant Transmittance). Meeting this requirement allows the transmission of both covers to be independent of the spectrum and AOI in order to algebraically isolate their optical intensity effects from the DUT's electrical values that will be measured. This is particularly significant for the soiled cover, as the soil layer can induce a wide range of AOI.

After making the transmission of both covers independent of the spectrum and AOI, the second requirement is that the constant transmission of the soiled and clean covers must be equal (referred to hereafter as (2) Same Transmittance).

The third requirement is that the incidence location of each spectral wavelength on the DUT cannot change under the influence of the covers and set-up (referred to hereafter as (3) Light-Incident Location). Meeting this requirement ensures that incoming light does not get absorbed at a different location on the DUT and/or partially miss it altogether because the DUT's external quantum efficiency is not spatially constant. Both cases will lead to cover-induced errors because the DUT's electrical performance (i.e., whether measured under the clean or soiled cover) will artificially change as a result of changing the direction of incoming light.

Figure 7:
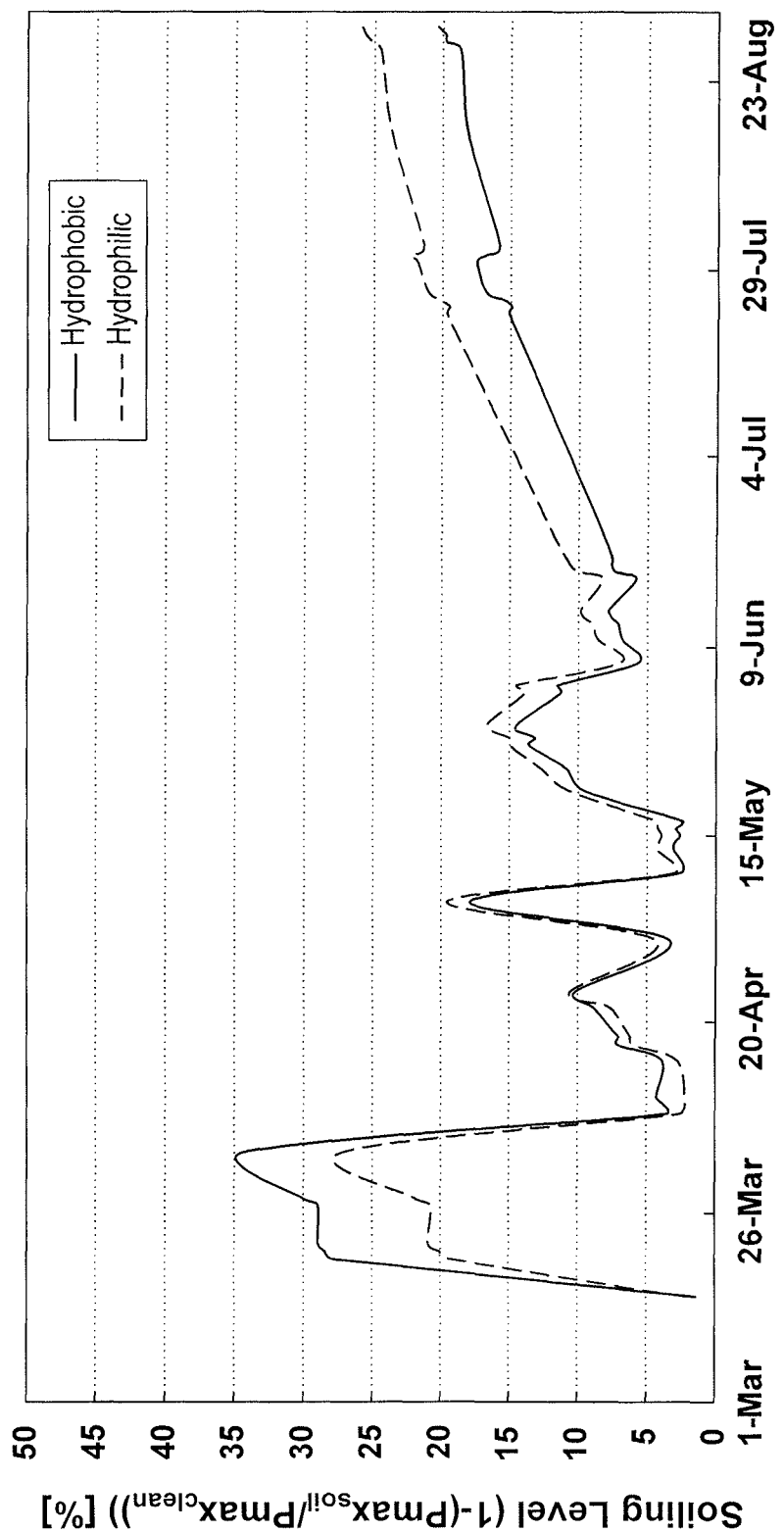
FIG. 7 is a plot comparing measured soiling loss as a function of time for hydrophilic and hydrophobic PV device surfaces.

Finally, the fourth and last requirement is that the soil distribution deposited on the soiled cover cannot be different than the distribution if soil was deposited directly on the DUT (referred to hereafter as (4) Soil Distribution). When soiling distribution is not the same, which can strongly depend on the difference between the front surface wettability properties of the cover and DUT, there can be high cover-induced errors because both incoming light intensity and direction will be different. FIG. 7 illustrates the dependency of soil accumulation behavior on the wettability properties of a cover's front surface. FIG. 7 shows the results of an experiment conducted in Kuwait under field conditions in 2018, comparing soiling levels of a hydrophobic and a hydrophilic front surface of the same mc-Si (multicrystalline) module over a period of six months.

It is important to note, that although meeting the aforementioned requirements is impractical because they are ideal, the EOSI method is optimized to realize them just enough to maintain acceptable measurement accuracy. Table 1, below, lists a summary of eight criteria set to fulfill the requirements, where the first six are related to the optical/physical properties of the covers, and last two are related to the physical measurement set-up. The first criteria mandates that both covers must have a mean refractive index of ≤1.5200 with a standard deviation of ≤0.0069 based on a coverage factor equal to 1 across a spectral range of 400 nm to 1200 nm (See FIG. 6, step 602). Using lower mean refractive index, lower standard deviation, and wider spectral range values will yield higher measurement accuracy. The second criteria mandates that the difference between the mean refractive indices of the two covers must be ≤0.035 (see FIG. 6, step 602). The third criteria mandates that both covers must have a mean absorption coefficient of ≤0.07 $cm^{-1}$ with a standard deviation of ≤0.05 $cm^{-1}$ based on a coverage factor equal to 1 across a spectral range of 400 nm to 1200 nm (see FIG. 6, step 604). Using lower mean absorption coefficient, lower standard deviation, and wider spectral range values will yield higher measurement accuracy. The fourth criteria mandates that both covers must have the same thickness and must be ≤4 mm (see FIG. 6, step 606). Using lower thickness values will yield higher measurement accuracy. The fifth criteria mandates that both covers must not have any surface textures on the front and back sides (See FIG. 6, step 608). The sixth criteria mandates that both covers must have the same wettability properties as the DUT's front surface (i.e., either hydrophilic or hydrophobic) (see FIG. 6, step 610). If the requirements of any one of steps 602-610 (relating to the optical properties of the transparent covers) is not met, step 618 prescribes taking corrective action. In the case of the optical properties specified in Table 1, rows 1-6 and steps 602-610, the simplest corrective action is to replace one or both transparent covers with covers that do meet the prescribed specifications.

Figure 6:
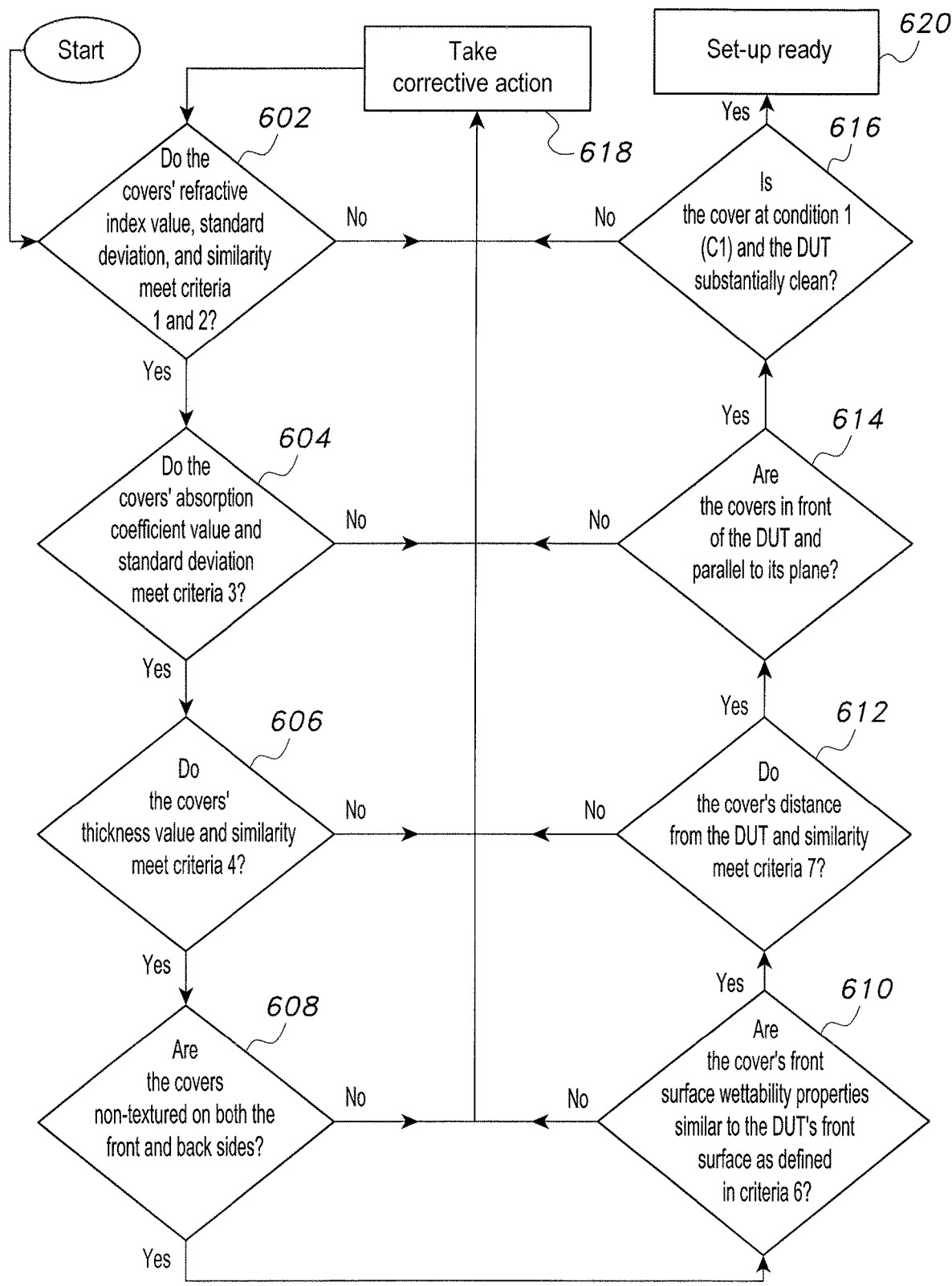
FIG. 6 is a flowchart of steps for ensuring that conditions for using the Electro-Optical Soiling Isolation (EOSI) method of measuring the effect of soiling on a photovoltaic device are fulfilled.

The seventh criteria mandates that the distance between the DUT and each cover must be the same and ≤20 mm (see FIG. 6, step 612). Using shorter distance values will yield higher measurement accuracy. As for the eighth and last criteria, it mandates that both covers must be fixed in front and parallel to the plane of the DUT (see FIG. 6, step 614). If the requirements of any one of steps 612-614 (relating to the physical set-up of the transparent covers) is not met, step 618 prescribes taking corrective action. In the case of the set-up properties specified in Table 1, rows 7-8 and steps 612-614, the corrective action is to adjust the apparatus so that the covers do meet the prescribed specifications.

Each of the eight criteria meets at least one of the four EOSI requirements necessary to consistently suppress cover-induced errors under any soiling concentration. For the purpose of longevity when using the EOSI method in the field, the covers should be mechanically and thermally robust to keep satisfying the relevant criteria over time. It is recommended that the covers pass the Static Load Test, Hail Test, and Thermal Cycling Test, as disclosed in IEC 61215. Once all of the eight criteria are met, the measurement set-up is ready and should look like the schematic diagrams shown in FIGS. 8A-8D.

For the EOSI method, the device 101 of FIGS. 1A and 1B may be modified by removing test station 121, leaving only test stations 122 and 123, as shown schematically in FIGS. 8A-8D. As shown in FIGS. 8A-8D, the transparent covers 130 of the clean test station 122 and the soiled test station 123 are coplanar and positioned above the DUT 113 when the measurements are made, the DUT 113 being spaced an equal distance from the transparent cover 130 when the measurements are made in both the clean test station 122 and the soiled test station 123. When the criteria specified in Table 1 and checked in steps 602-614 are met, the transparent cover 130 and DUT 113 at test station 122 may be cleaned, if necessary (step 616), and the device set-up is ready (step 620) to proceed with taking measurements.

Figure 9A:
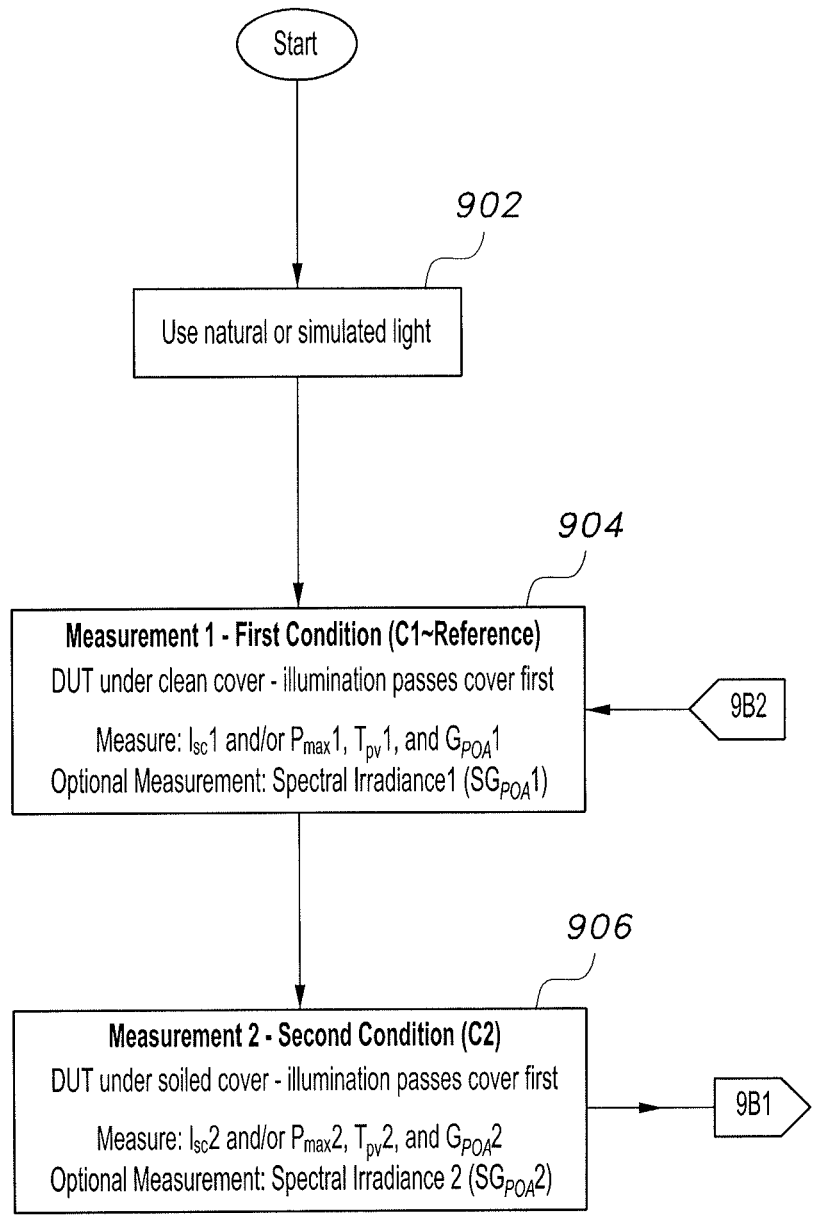
FIGS. 9A, 9B, 9C are a flowchart showing the steps in the Electro-Optical Soiling Isolation (EOSI) method to measure the effect of soiling on a photovoltaic device.
Figure 9B:
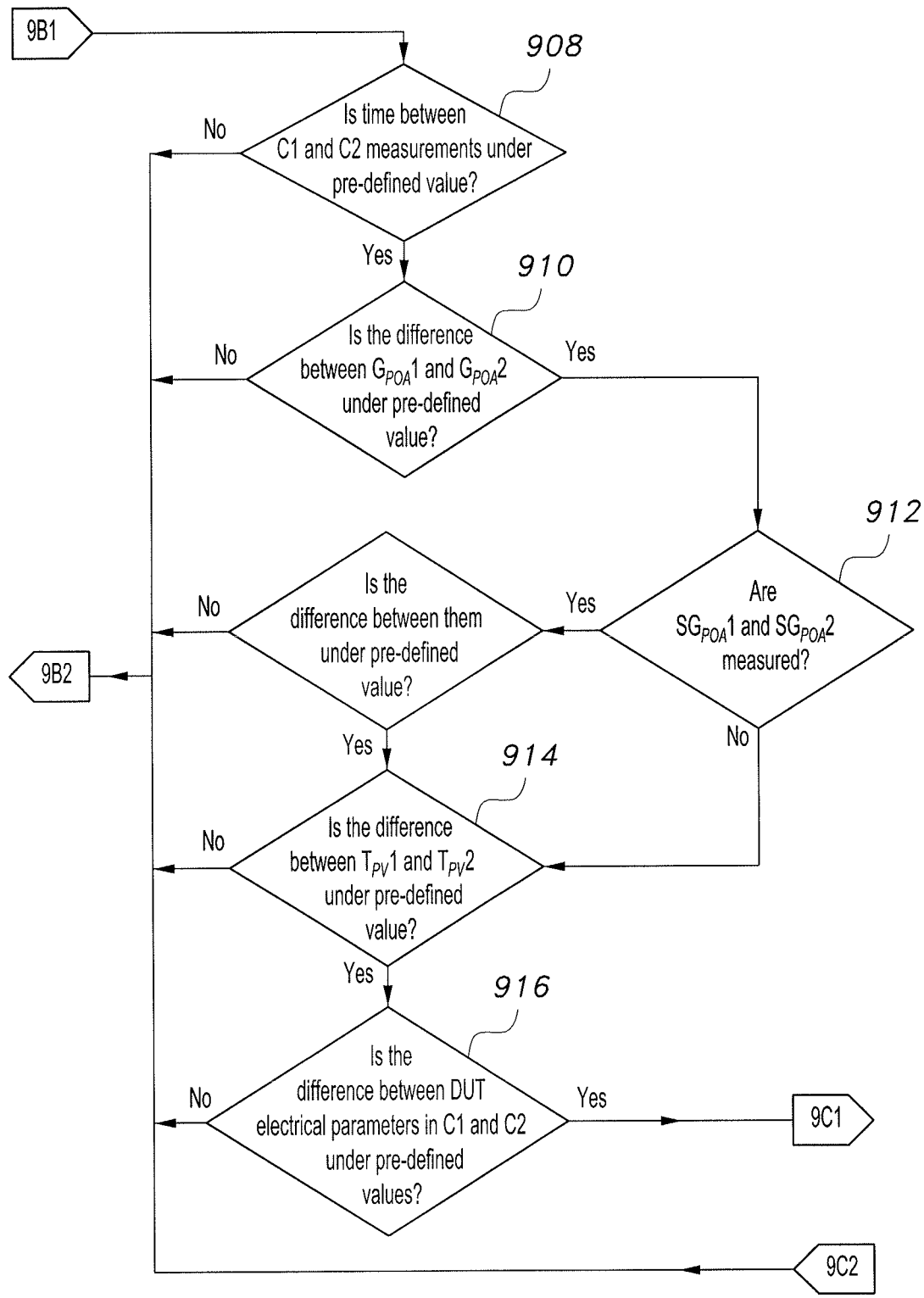
Figure 9C:
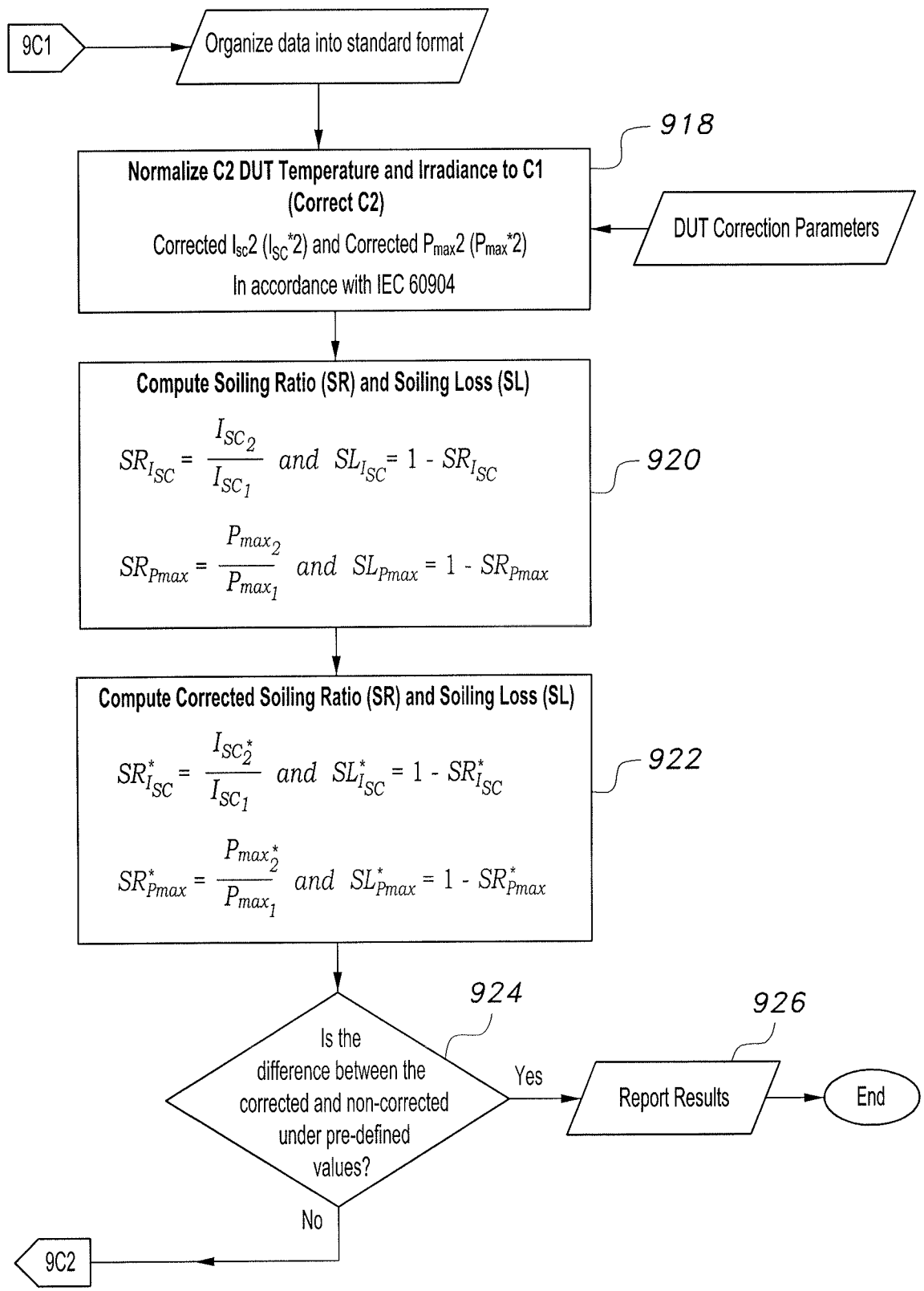

After the device has been set up, measurements are ready to commence (the third step of the EOSI method), where the complete process can be followed in FIGS. 9A-9C. The DUT's electrical output is first measured underneath a clean cover, while natural or simulated light is illuminated through the cover (step 902) and onto the DUT, defining a first state or condition (C1) (step 904). A second electrical output measurement of the DUT is then measured underneath a naturally or artificially soiled cover, while natural or simulated light is illuminated through the cover and onto the DUT, defining a second state or condition (C2) (step 906). In both states, the DUT's electrical output measurement is represented by its $I_{sc}$ and $P_{max}$. Additionally, the DUT's back-surface temperature ($T_{PV}$), plane-of-array irradiance ($G_{POA}$), and plane-of-array spectral irradiance ($SG_{POA}$) (i.e., this last parameter is optional) shall also be measured in C1 and C2.

FIG. 9 also shows a flowchart of EOSI's quality control procedure (i.e., step 4 of the EOSI method). The purpose of this data screening process is to minimize measurement error and uncertainty and to detect possible instrument faults.

The first parameter that is examined is the time between the electrical measurements taken in C1 and C2 (step 908). Ideally, it should be as short as possible to minimize temperature and irradiance correction errors. However, if it is longer than a pre-defined value the step of taking measurements shall be repeated.

If, on the other hand, the time is sufficiently small, the next parameter will be examined. This parameter is the difference between irradiance measured in C1 and C2 (step 910). Ideally, it should be as small as possible to minimize irradiance correction errors. However, if the difference is

TABLE 1

EOSI method criteria and specifications

| Criteria | Cover Property | Specification | Targeted Requirement | Notes |
|---|---|---|---|---|
| 1 | Refractive Index | Mean Value ≤1.5200 Standard Deviation ≤±0.0069 (Coverage Factor k = 1) | (1) Constant Transmittance | Spectral range is between 400 nm to 1200 nm |
| 2 | Refractive Index Between Covers | Difference in Mean Value ≤0.035 | (2) Same Transmittance | |
| 3 | Absorption Coefficient | Mean Value ≤0.07 cm$^{-1}$ Standard Deviation ≤0.05 cm$^{-1}$ (Coverage Factor k = 1) | (1) Constant Transmittance | Spectral range is between 400 nm to 1200 nm |
| 4 | Thickness | Value ≤4 mm | (1) Constant Transmittance | Both covers must have the same thickness |
| 5 | Surface Texture | No Texture | (1) Constant Transmittance (2) Same Transmittance (3) Light-Incident-Location | This applies to both the front and back sides |
| 6 | Front Surface Wettability | Either hydrophilic or hydrophobic | (4) Soil Distribution | Both front surface covers must have same wettability properties compared to the DUT's front surface |

| Criteria | Set-up Property | Specification | Targeted Requirement | Notes |
|---|---|---|---|---|
| 7 | Cover Distance From DUT | Value ≤20 mm | (3) Light-Incident-Location | Both covers shall have the same distance away from the DUT |
| 8 | Cover Plane | Both Covers Parallel to DUT Plane | (2) Same Transmittance (3) Light-Incident-Location (4) Soil Distribution | | above a pre-defined value, this is a strong indication that a sudden cloud passed by when measuring C1 or C2. Therefore, the step of taking measurements shall be repeated.

However, if the difference is sufficiently small, the next parameter will be examined. This parameter is the difference between spectral irradiance measured in C1 and C2 (step 912). Since measuring this parameter is optional, it shall not be checked unless it is used. Ideally, it should be as small as possible to increase measurement accuracy and certainty. However, if it is above the pre-defined values, the step of taking measurements shall be repeated.

On the other hand, if it is sufficiently small, the next parameter will be examined. This parameter is the difference in DUT temperature measured in C1 and C2 (step 914). Ideally, it should be as small as possible to minimize temperature correction errors. If it is above a pre-defined value, this is a strong indication that one or both of the temperature sensors are faulty because the time scale for DUT thermal changes is often much larger than the time between C1 and C2. Therefore, the temperature sensors must be fixed and the step of taking measurements shall be repeated.

If, however, the temperature difference is sufficiently small, the next and final parameter will be examined. This parameter is the difference between the $I_{sc}/P_{max}$ measured in C1 and C2 (step 916). This difference is not constant, and it will increase with time as soil accumulation increases. Having said that, when observing the difference historically (i.e., in the past day or month), an appropriate daily or monthly pre-defined value can be attained. If the difference is above that pre-defined value, this is a strong indication that the instruments measuring $I_{sc}$ and $P_{max}$ are faulty. Therefore, they must be fixed, and the step of taking measurements shall be repeated.

FIG. 9 provides a flowchart of EOSI's fifth and last step, which computes SR and SL. The former parameter represents the ratio of the DUT's power output under a soiled condition over its output under a clean condition, while the latter represents the fractional power output the DUT loses due to soiling. The relationship between the two parameters is shown in equation (1). To compute SR and SL, first, irradiance and the DUT temperature at C1 and C2 shall be normalized (step 918), such that weather conditions between the two are the same, and the soiling effect on the DUT is isolated. Therefore, the $I_{sc}$ and $P_{max}$ measured at C2 will be corrected to match the irradiance and DUT temperature measured at C1, making C1 the reference condition. All corrections shall be carried out in accordance with IEC 60904, using the correction parameters obtained as shown in FIG. 5.

$$SL = 1 - SR. \qquad (1)$$

Once the corrections are complete, SR and SL can then be computed. First, they will be calculated using the non-corrected $I_{sc}$ and $P_{max}$ values at C1 and C2 (step 920). Then, they will be calculated using corrected ones (step 922). After that, the difference between the non-corrected and corrected SR/SL shall be examined (step 924). As a result of the quality control procedure described above, pre-defined values can be attained. If the difference is above the pre-defined values, this is a strong indication that a fault occurred while processing the data to compute SR and SL. In such a case, the issue must be fixed, and the step of taking measurements shall be repeated. If, however, the difference is sufficiently small, the SR and SL values shall be recorded (step 926), and the measurement is then complete.

As for the reason why both $I_{sc}$ and $P_{max}$ are used to obtain SR and SL, it is because $I_{sc}$ is not always accurate. While $I_{sc}$-based SR/SL measurements are acceptable to estimate power loss for uniform soiling, it is not for non-uniform distributions. This is because the DUT's Fill Factor (i.e., an important parameter that determines power output) is sensitive to soiling uniformity. Therefore, in order to maintain measurement accuracy under non-uniform conditions, $P_{max}$-based SR/SL values shall be used.

While discussing SR (hence, SL as well), it is important to review the formula employed by the EOSI method as it plays a role in minimizing cover-induced errors. Unlike the first SPSD method where the SR formula requires the DUT to be measured under three different conditions as shown in equation (2) and (3), this method utilizes the same SR formulas used in conventional techniques that compare two PV devices, as depicted in equation (4) and (5), as follows:

$$SR_{Isc} = 1 - \frac{I_{SC\_clean\_cover} - I_{SC\_soiled\_cover}}{I_{SC\_no\_cover}}, \qquad (2)$$

$$SR_{Pmax} = 1 - \frac{P_{max\_clean\_cover} - P_{max\_soiled\_cover}}{P_{max\_no\_cover}}, \qquad (3)$$

$$SR_{Isc} = \frac{I_{SC\_soiled}}{I_{SC\_clean}}, \qquad (4)$$

$$SR_{Pmax} = \frac{P_{max\_soiled}}{P_{max\_clean}}, \qquad (5)$$

where $I_{SC\_no\_cover}$, $I_{SC\_clean\_cover}$, and $I_{SC\_soiled\_cover}$ is the DUT's $I_{SC}$ when measured under no cover, clean cover, and soiled cover, respectively, as defined by the first SPSD method, $I_{SC\_clean}$ is the DUT's $I_{SC}$ when it is clean, and $I_{SC\_soiled}$ is the DUT's $I_{sc}$ when it is soiled. Note that all of the $I_{SC}$ definitions apply similarly to $P_{max}$.

Normally, using equation (4) and (5) for SPSD set-ups, where instead of comparing two PV devices, only one is compared under a clean and soiled cover, can result in high cover-induced errors. However, the extensive work provided by the steps provided in FIG. 6 and the specifications described in Table 1 allows the use of those equations while algebraically eliminating the covers' impact on changing the incoming light's intensity. To demonstrate mathematically how the EOSI criteria, in conjunction with equation (4) and (5) can achieve this, we will start with the extended SR equations for the EOSI set-up shown in equation (6) and (7), as follows:

$$SR_{Isc} = \frac{Aq \int_{\lambda_1}^{\lambda_2} \Phi(\lambda) EQE(\lambda) T_{SC}(\lambda) T_s(\lambda) d\lambda}{Aq \int_{\lambda_1}^{\lambda_2} \Phi(\lambda) EQE(\lambda) T_{CC}(\lambda) d\lambda}, \qquad (6)$$

$$SR_{Pmax} = \frac{V_{oc} FF A q \int_{\lambda_1}^{\lambda_2} \Phi(\lambda) EQE(\lambda) T_{SC}(\lambda) T_s(\lambda) d\lambda}{V_{oc} FF A q \int_{\lambda_1}^{\lambda_2} \Phi(\lambda) EQE(\lambda) T_{CC}(\lambda) d\lambda}, \qquad (7)$$

where A is the active area of the DUT, q is the elementary positive charge, $\Phi$ is the photon flux, EQE is the external quantum efficiency of the DUT, $T_{CC}$ is the transmittance of the clean cover, $T_{SC}$ is the transmittance of the soiled cover, and $T_S$ is the transmittance of soil, $V_{oc}$ is the open-circuit voltage of the DUT, and FF is the fill factor of the DUT. Applying criteria 1 of Table 1 and the steps shown in FIG.

9 will isolate $T_{CC}$ and $T_{SC}$ by bringing them outside the integral sign, as can be seen in equation (8) and (9):

$$SR_{Isc} = \frac{AqT_{SC}\int_{\lambda_1}^{\lambda_2}\Phi(\lambda)EQE(\lambda)T_s(\lambda)d\lambda}{AqT_{CC}\int_{\lambda_1}^{\lambda_2}\Phi(\lambda)EQE(\lambda)d\lambda}, \quad (8)$$

$$SR_{Pmax} = \frac{V_{oc}FFAqT_{SC}\int_{\lambda_1}^{\lambda_2}\Phi(\lambda)EQE(\lambda)T_s(\lambda)d\lambda}{V_{oc}FFAqT_{CC}\int_{\lambda_1}^{\lambda_2}\Phi(\lambda)EQE(\lambda)d\lambda}. \quad (9)$$

Once $T_{CC}$ and $T_{SC}$ are isolated, applying criteria 2, 5, and 8 of Table 1 will ensure that those two values are equal, such that they result in unity and cancel themselves out. This outcome represents the elimination of the soiled and clean cover alteration of light intensity. Therefore, equation (8) and (9) will ultimately reduce down to equation (4) and (5), hence explaining why the EOSI method uses the conventional SR formulas.

It is important to note that there are still two other effects induced by the cover that are not mathematically suppressed using the above-mentioned equations. The first is the alteration of light direction as it passes through the covers, and the second is the alteration of both light direction and intensity as a result of having a different soiling distribution than the actual distribution that would accumulate on the DUT. Those two sources of cover-induced errors are minimized by applying criteria 5-8 of Table 1.

Finally, the EOSI method only requires two DUT measurements rather than three (i.e., when compared to the first SPSD method) to compute SR. This leads to a further increase in measurement accuracy and certainty for two reasons. The first is because reducing the number of inputs of the SR formula will reduce the propagation of uncertainty, as reported in ISO 98-3. The second is because reducing the number of DUT measurement conditions will reduce the number of temperature/irradiance corrections required, and reduce the quantitative extent of the corrections because the time to acquire all the necessary measurements will be less, and hence weather fluctuations will be smaller, leading to fewer errors. Therefore, requiring only two conditions optimizes multiple areas of the measurement process.

In summary, the disclosed EOSI method provides a comprehensive five-step process to measure power loss due to soiling on PV devices. It sets extensive optical and physical requirements on the transparent covers and the measurement set-up to suppress and stabilize cover-induced errors, which rendered an issue with the first SPSD method. Furthermore, the elimination of a third condition under which the PV device is measured further reduces multiple sources of errors. This method also considers practical cost and O&M protocols, placing it in a competitive position compared to commercially available field sensors. The EOSI method is, therefore, a cost-effective pathway to monitor PV system soiling losses with higher accuracy, reproducibility, and range of operation.

It is to be understood that the device and method for measuring the effect of soiling on a photovoltaic device is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A method for measuring effect of soiling on a photovoltaic device, comprising the steps of:
    obtaining correction parameters for a single photovoltaic device under test (DUT), the correction parameters including correction parameters for irradiance and temperature of the device under test;
    preparing set-up of a measuring device, the measuring device having test stations consisting of a first test station having a transparent cover maintained in a clean condition and a second test station having a transparent cover exposed to soiling;
    taking measurements of electrical parameters of the single photovoltaic DUT when exposed to radiation from a light source while disposed under the clean transparent cover at the first test station, and then taking measurements of the same electrical parameters of the single photovoltaic DUT when exposed to radiation from a light source while disposed under the soiled transparent cover at the second test station, the measurements of electrical parameters of the single photovoltaic DUT includes measuring output of the DUT, wherein the measurement of output includes:
        i) measuring the short circuit current ($I_{sc}$);
        ii) measuring maximum power ($P_{max}$);
        iii) measuring the DUT's back-surface temperature ($T_{PV}$) and the plane-of-array irradiance ($G_{POA}$); and
        iv) measuring the DUT's plane-of-array spectral irradiance ($SG_{POA}$);
    comparing measurement parameters to predetermined values to ensure quality control; and
    computing Soiling Ratio (SR) and Soiling Loss (SL).

2. The method for measuring effect of soiling on a photovoltaic device according to claim 1, wherein said step of obtaining correction parameters further comprises obtaining the correction parameters by experiments complying with IEC standard 60904.

3. The method for measuring effect of soiling on a photovoltaic device according to claim 1, wherein said step of obtaining correction parameters further comprises obtaining the correction parameters from a data sheet supplied by a manufacturer of the single photovoltaic device under test.

4. The method for measuring effect of soiling on a photovoltaic device according to claim 1, wherein said step of preparing set-up of the measuring device further comprises the steps of:
    (a) confirming that both the transparent cover of the first test station and the transparent cover of the second test station have a mean refractive index ≤1.5200 with a standard deviation of ≤0.0069 based on a coverage factor equal to 1 across a spectral range of 400 nm to 1200 nm;
    (b) confirming that the difference between the mean refractive index of the transparent cover of the first test station and the mean refractive index of the transparent cover of the second test station is ≤0.035;
    (c) confirming that both the transparent cover of the first test station and the transparent cover of the second test station have a mean absorption coefficient of ≤0.07 cm$^{-1}$ with a standard deviation of ≤0.05 cm$^{-1}$ based on a coverage factor equal to 1 across a spectral range of 400 nm to 1200 nm;
    (d) confirming that both the transparent cover of the first test station and the transparent cover of the second test station have the same thickness and the thickness is ≤4 mm;

(e) confirming that both the transparent cover of the first test station and the transparent cover of the second test station do not have any surface textures on front and back sides of the covers; and (f) confirming that both the transparent cover of the first test station and the transparent cover of the second test station are hydrophobic when the single photovoltaic device under test has a hydrophobic front surface and that both the transparent cover of the first test station and the transparent cover of the second test station are hydrophilic when the single photovoltaic device under test has a hydrophilic front surface.

5. The method for measuring effect of soiling on a photovoltaic device according to claim 4, wherein steps (a) through (f) further comprise the step of replacing one or both of the transparent covers to ensure compliance with each of steps (a) through (f).

6. The method for measuring effect of soiling on a photovoltaic device according to claim 4, wherein said step of preparing set-up of the measuring device further comprises the steps of:
confirming that both the transparent cover of the first test station and the transparent cover of the second test station are spaced an equal distance from the single photovoltaic DUT when measurements are made and that the distance between the DUT and each of the covers is ≤20 mm; and
confirming that both the transparent cover of the first test station and the transparent cover of the second test station are fixed in front of and parallel to a plane defined by the DUT.

7. The method for measuring effect of soiling on a photovoltaic device according to claim 1, wherein said step of comparing measurement parameters to predetermined values further comprises:
comparing a difference in time between taking measurements of electrical parameters at the first test station and taking measurements of electrical parameters at the second test station with a predetermined value and repeating the step of taking measurements of electrical parameters when the difference in time exceeds the predetermined value;
comparing a difference in plane-of-allay irradiance ($G_{POA}$) measured at the first test station and the second test station with a predetermined value and repeating the step of taking measurements of electrical parameters when the difference in plane-of-array irradiance ($G_{POA}$) measurements exceeds the predetermined value;
comparing a difference in temperature of the single photovoltaic DUT measured at the first test station and the second test station with a predetermined value and repeating the step of taking measurements of electrical parameters when the difference in DUT temperature measurements exceeds the predetermined value; and
comparing a difference in $I_{sc}/P_{max}$ measured at the first test station and the second test station with a predetermined value and repeating the step of taking measurements of electrical parameters when the difference in $I_{sc}/P_{max}$ measurements exceeds the predetermined value.

8. The method for measuring effect of soiling on a photovoltaic device according to claim 7, further comprising the step of comparing a difference in plane-of-array spectral irradiance ($SG_{POA}$) measured at the first test station and the second test station with a predetermined value and repeating the step of taking measurements of electrical parameters when the difference in plane-of-array spectral irradiance ($SG_{POA}$) measurements exceeds the predetermined value.

9. The method for measuring effect of soiling on a photovoltaic device according to claim 7, wherein at least one of said predetermined values comprises a periodic value based upon a history of prior measurements made with the same measuring device.

10. The method for measuring effect of soiling on a photovoltaic device according to claim 1, wherein said step of computing Soiling Ratio (SR) and Soiling Loss (SL) further comprises the steps of:
calculating the Soiling Ratio (SR) as a ratio of uncorrected values of DUT output measured at the second test station divided by DUT output measured at the first test station, and Soiling Loss as 1-SR;
correcting DUT output measured at the second test station for irradiance and DUT temperature using the correction parameters obtained in said obtaining correction parameters step to normalize output measured at the second test station to values measured at the first test station;
calculating a corrected Soiling Ratio (SR) as a ratio of the corrected DUT output measured at the second test station divided by the DUT output measured at the first test station, and Soiling Loss as 1-SR;
calculating a difference between the corrected SR and the SR calculated without correction and comparing the difference in SR values to a predetermined value; and
repeating said taking measurements of electrical parameters step, said comparing measurement parameters to predetermined values step, and said computing Soiling Ratio (SR) and Soiling Loss (SL) when the difference between the corrected SR and the SR calculated without correction exceeds the predetermined value.

11. The method for measuring effect of soiling on a photovoltaic device according to claim 10, wherein said DUT output comprises short circuit current, whereby the Soiling Ratio is calculated as:

$$SR_{Isc} = \frac{I_{SC_{soiled}}}{I_{SC_{clean}}},$$

wherein $I_{SC_{soiled}}$ is DUT output measured at the second test station and $I_{SC_{clean}}$ is DUT output measured at the first test station.

12. The method for measuring effect of soiling on a photovoltaic device according to claim 10, wherein said DUT output comprises maximum power, whereby the Soiling Ratio is calculated as:

$$SR_{Pmax} = \frac{P_{max\_soiled}}{P_{max\_clean}},$$

wherein $P_{max\_soiled}$ is DUT output measured at the second test station and $P_{max\_clean}$ is DUT output measured at the first test station.

13. A method for measuring effect of soiling on a single photovoltaic device, comprising the steps of:
measuring output of the single photovoltaic device under test (DUT) positioned under a first transparent cover and exposed to irradiation by a light source, the first transparent cover being maintained in a clean condition;

measuring output of the single photovoltaic DUT when the DUT is positioned under a second transparent cover and exposed to irradiation by a light source, the second transparent cover being exposed to soiling, the first and second transparent covers being matched so that the covers have identical optical properties, the DUT being positioned an equal distance below the transparent covers when measuring the DUT output, the covers being coplanar and parallel to a plane defined by the DUT, wherein the identical optical properties include:
  i) a mean refraction index $\leq 1.5200$ with a standard deviation of $\leq 0.0069$ based on a coverage factor equal to 1 across a spectral range of 400 nm to 1200 nm, the mean refraction index of the two covers having a difference $\leq 0.035$;
  ii) a mean absorption coefficient of $\leq 0.07$ $cm^{-1}$ with a standard deviation of $\leq 0.05$ $cm^{-1}$ based on a coverage factor equal to 1 across a spectral range of 400 nm to 1200 nm;
  iii) an identical thickness $\leq 4$ mm;
  iv) an absence of surface textures on front and back sides of the covers; and
  v) wettability properties identical to each other and to a front surface of the DUT; and
calculating a Soiling Ratio (SR) as a ratio of the DUT output measured under the cover exposed to soiling divided by DUT output measured under the cover maintained in a clean condition, and calculating Soiling Loss (SL) as SL=1−SR.

\* \* \* \* \*